(12) United States Patent
Lin et al.

(10) Patent No.: US 7,005,698 B2
(45) Date of Patent: Feb. 28, 2006

(54) SPLIT GATE FLASH MEMORY CELL

(75) Inventors: Chi-Hui Lin, Taipei (TW); Jeng-Ping Lin, Taoyuan Hsien (TW); Pei-Ing Lee, Taipei Hsien (TW); Jih-Chang Lien, Taoyuan Hsien (TW)

(73) Assignee: Nanya Technology Corporation, Taoyuan (TW)

( * ) Notice: Subject to any disclaimer, the term of this patent is extended or adjusted under 35 U.S.C. 154(b) by 244 days.

(21) Appl. No.: 10/668,902

(22) Filed: Sep. 23, 2003

(65) Prior Publication Data

US 2004/0057328 A1 Mar. 25, 2004

Related U.S. Application Data

(62) Division of application No. 10/307,704, filed on Dec. 2, 2002, now Pat. No. 6,734,066.

(60) Provisional application No. 60/383,481, filed on May 24, 2002.

(51) Int. Cl.
*H01L 29/788* (2006.01)
(52) U.S. Cl. .................................................. 257/315
(58) Field of Classification Search ........ 257/314–320, 257/E29.129, E21.179, E21.422, E21.68, 257/E21.681, E21.685, E21.687, E21.688; 438/257–267
See application file for complete search history.

(56) References Cited

U.S. PATENT DOCUMENTS

| | | | | |
|---|---|---|---|---|
| 5,429,970 A | * | 7/1995 | Hong | 438/259 |
| 5,606,521 A | * | 2/1997 | Kuo et al. | 365/149 |
| 6,124,608 A | * | 9/2000 | Liu et al. | 257/315 |
| 6,255,689 B1 | * | 7/2001 | Lee | 257/314 |
| 6,303,439 B1 | * | 10/2001 | Lee et al. | 438/259 |
| 6,391,719 B1 | * | 5/2002 | Lin et al. | 438/259 |
| 2001/0038118 A1 | * | 11/2001 | Sakui et al. | 257/315 |
| 2002/0024081 A1 | * | 2/2002 | Gratz | 257/301 |

* cited by examiner

*Primary Examiner*—Brook Kebede
(74) *Attorney, Agent, or Firm*—Quintero Law Office

(57) ABSTRACT

A split gate flash memory cell. The memory cell includes a substrate, a conductive line, source/drain regions, an insulating layer, a conductive spacer, an insulating stud, a first conductive layer, and a first insulating spacer. The conductive line is disposed in a lower portion of the trench of the substrate. The source region is formed in the substrate adjacent to an upper portion of the conductive line having the insulating layer thereon. The conductive spacer is disposed on the upper sidewall of the trench serving as a floating gate. The insulating stud is disposed on the insulating layer. The first conductive layer is disposed over the substrate adjacent to the conductive spacer serving as a control gate. The first insulating spacer is disposed on the sidewall of the insulating stud to cover the first conductive layer. The drain region is formed in the substrate adjacent to the first conductive layer.

21 Claims, 12 Drawing Sheets

SPLIT GATE FLASH MEMORY CELL

CROSS REFERENCE TO RELATED APPLICATION

This is a divisional application of U.S. patent application Ser. No. 10/307,704, filed on Dec. 2, 2002 U.S. Pat. No. 6,734,066 which claims the benefit of priority to U.S. Provisional Application 60/383,481, filed May 24, 2002.

BACKGROUND OF THE INVENTION

1. Field of the Invention

The present invention relates in general to a semiconductor device and method for fabricating the same. More particularly, it relates to a reduced-size split gate flash memory cell that increases integration with ICs.

2. Description of the Related Art

Non-volatile memory, such as flash memory, stores data regardless of electrical power supplied, and reads and writes data by controlling a threshold voltage of a control gate. Conventionally, flash memory includes a floating gate and a control gate. The floating gate stores charge and the control gate reads and writes data. Since flash memory has a high operating speed, it is widely applied for consumer electrical goods, such as digital cameras, mobile phones, personal stereos, and laptops.

FIGS. 1A–1F are cross-sections showing a conventional method of fabricating a split gate flash memory cell.

First, in FIG. 1A, a silicon substrate 10 is provided, and a thin silicon oxide layer 12 is formed thereon serving as a tunneling oxide layer. The tunneling oxide layer 12 can be formed by thermal oxidation. Next, a polysilicon layer 14 and a silicon nitride layer 16 are sequentially deposited on the tunneling oxide layer 12.

Next, in FIG. 1B, a photoresist layer 18 is coated on the silicon nitride layer 16, leaving a portion exposed. Thereafter, the exposed portion of the silicon nitride layer 16 is etched to form an opening 20 exposing the polysilicon layer 14.

Next, in FIG. 1C, the photoresist layer 18 is stripped and thermal oxidation is performed on the exposed polysilicon layer 14 using the remaining silicon nitride layer 16a as a mask to form a thick oxide layer 24 having tipped and thin portions 24a, 24b at its edge.

Next, in FIG. 1D, with the remaining silicon nitride layer 16a is removed by wet etching to expose the polysilicon layer 14.

Next, in FIG. 1E, the polysilicon layer 14 is etched by anisotrpic etching using thick oxide layer 24 as a mask to the tunneling oxide layer 12. The remaining polysilicon layer 14a is used as a floating gate.

Finally, in FIG. 1F, a gate dielectric layer 28, a control gate 30, and source region S/drain region D are formed and the tunneling oxide layer 12 uncovered by control gate 30 and the floating gate 14a is removed to finish the fabrication of the split gate flash memory cell.

However, in the fabrication of the conventional split gate flash memory, it is difficult to align the control gate and control the critical dimension (CD) of the control gate. Moreover, since increasing the integration of ICs is imperative, the conventional split gate flash memory is no longer suitable for small devices.

SUMMARY OF THE INVENTION

Accordingly, an object of the invention is to provide a novel split gate flash memory cell and method of fabricating the same to reduce the size of the flash memory cell by forming the source line and the floating gate in the trench of the substrate.

According to one aspect, the invention provides a method of fabricating a split gate flash memory cell. First, a substrate having a trench is provided, and a conductive line insulated from the substrate is formed in a lower portion of the trench serving as a source line. Next, a source region is formed in the substrate adjacent to an upper portion of the conductive line. Next, an insulating layer is formed on the conductive line. Next, a conductive spacer is formed on the upper sidewall of the trench serving as a floating gate, protruding and insulated from the substrate. Next, an insulating stud is formed on the insulating layer, wherein the insulating stud is higher than the conductive spacer in height. Next, a first conductive layer is formed over the substrate adjacent to the conductive spacer, wherein the first conductive layer is insulated from the conductive spacer and the substrate, respectively. Next, a first insulating spacer is formed on the sidewall of the insulating stud to cover a part of the first conductive layer. Next, the first conductive layer is removed using the first insulating spacer as a mask to expose the substrate and the remaining conductive layer is used as a control gate. Finally, a drain region is formed in the exposed substrate.

According to another aspect, the invention provides a split gate flash memory cell. The memory cell includes a substrate having a trench, a conductive line disposed in a lower portion of the trench and insulated from the substrate serving as a source line, a source region formed in the substrate adjacent to an upper portion of the conductive line, and an insulating layer disposed on the conductive line. A conductive spacer is disposed on the upper sidewall of the trench serving as a floating gate, protruding and insulated from the substrate. An insulating stud is disposed on the insulating layer, with the top thereof higher than that of the conductive spacer in height. A first conductive layer is disposed over the substrate adjacent to the conductive spacer serving as a control gate, and is insulated from the conductive spacer and the substrate, respectively. A first insulating spacer disposed on the sidewall of the insulating stud covers the first conductive layer, and a drain region is formed in the substrate adjacent to the first conductive layer.

The conductive spacer and the first conductive layer are doped polysilicon. The insulating layer is high density plasma oxide. The first insulating stud is silicon oxide or boron silicate glass. The first insulating spacer is silicon nitride.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE INVENTION

A preferred embodiment of the present invention is now described with reference to FIGS. 2–19.

Figure 1A:
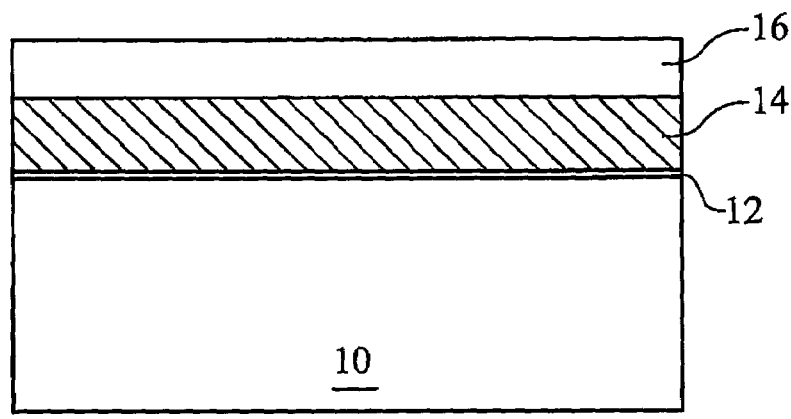
FIGS. 1A–1F are cross-sections showing a conventional method of fabricating a split gate flash memory cell.
Figure 1B:
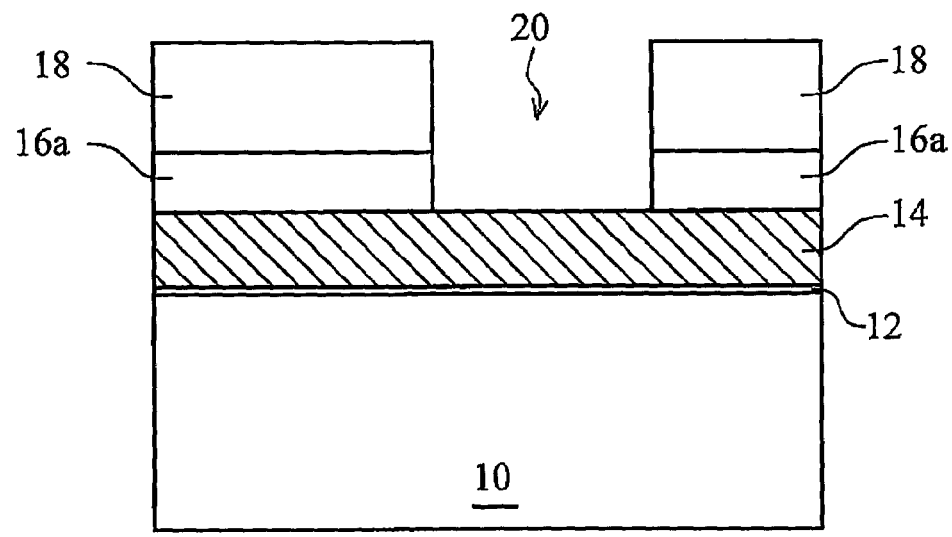
Figure 1C:
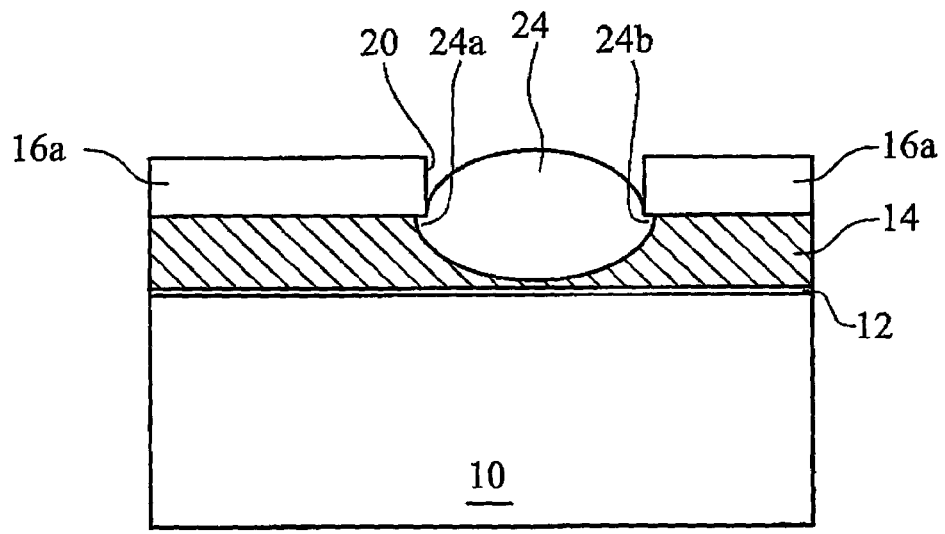
Figure 1D:
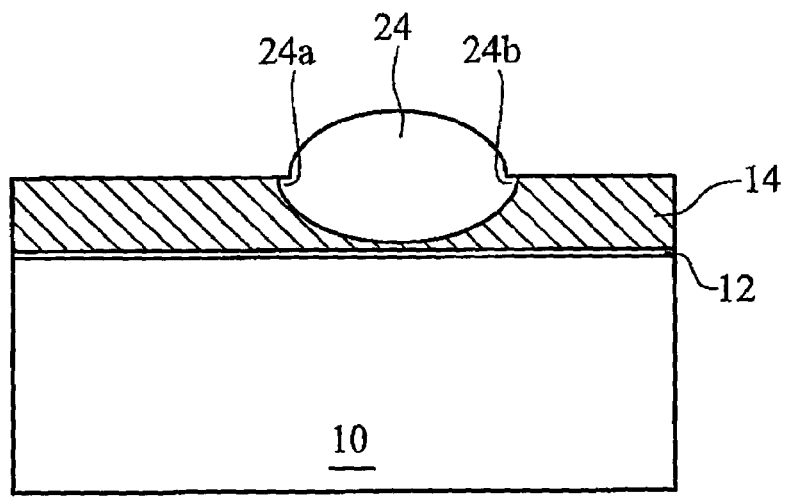
Figure 1E:
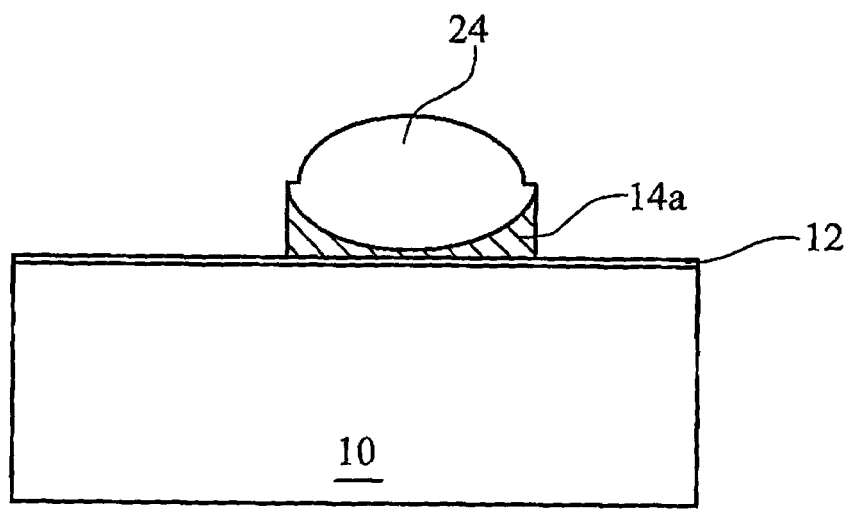
Figure 1F:
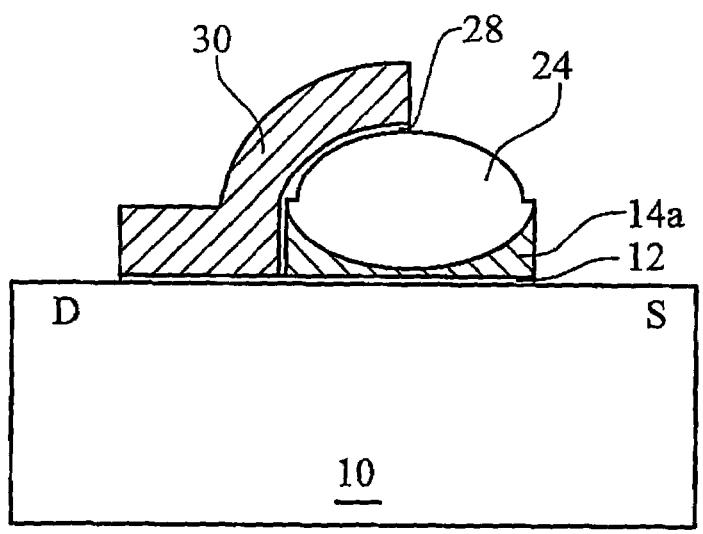
Figure 2:
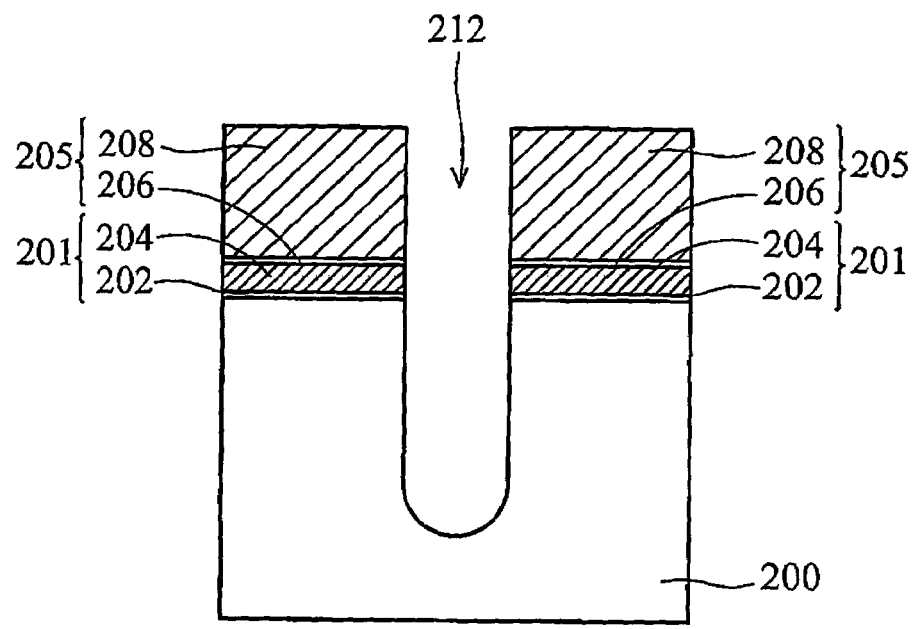
FIGS. 2–19 are cross-sections showing a method of fabricating a split gate flash memory cell according to the present invention.

In FIG. 2, a substrate 200, such as a silicon wafer, is provided. Next, a first mask layer 201 and a second mask layer 205 are formed on the substrate 200 in sequence. In this invention, the first mask layer 201 is composed of a pad oxide 202 and a silicon nitride layer 204, and the second mask layer 205 is composed of a pad oxide 206 and a silicon nitride layer 208. Next, an opening is formed in the second and first mask layers 205,201 to expose the substrate 200 by lithography and etching. Finally, the substrate 200 under the opening is etched to form a deep trench 212 having a predetermined depth, for example, about 3~7 μm.

Figure 3:
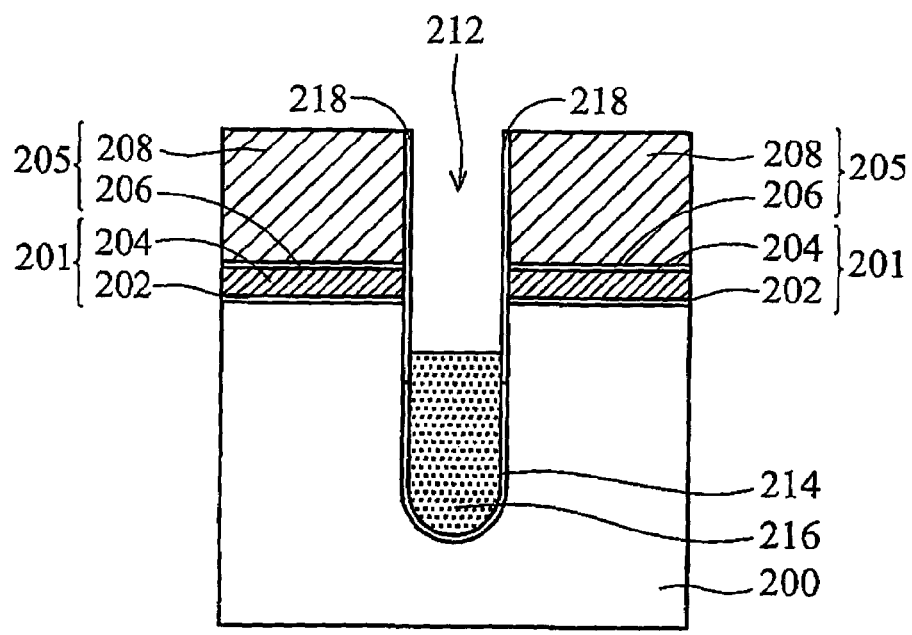

In FIG. 3, a conformable liner oxide 214 is formed on the second mask layer 205 and the surface of the trench 212 by conventional deposition, such as chemical vapor deposition (CVD). Thereafter, a conductive layer 216, such as polysilicon layer, is deposited over the second mask layer 205 and filled into the trench 212. Next, the excess conductive layer 216 over the second mask layer 205 is removed by chemical mechanical polishing (CMP) or dry etching. Next, the liner oxide 214 and the conductive layer 216 in the trench 212 are etched back by anisotropic etching, such as dry etching, or isotropic etching, such as wet etching, to reduce their levels below the surface of the substrate 200. Next, a conformable insulating layer (not shown), such as silicon nitride layer, is formed on the second mask layer 205 and the surface of the trench 212 by CVD. Thereafter, the insulating layer is etched by anisotropic etching, such as dry etching, to form an insulating spacer 218 on the sidewall of the trench 212.

Figure 4:
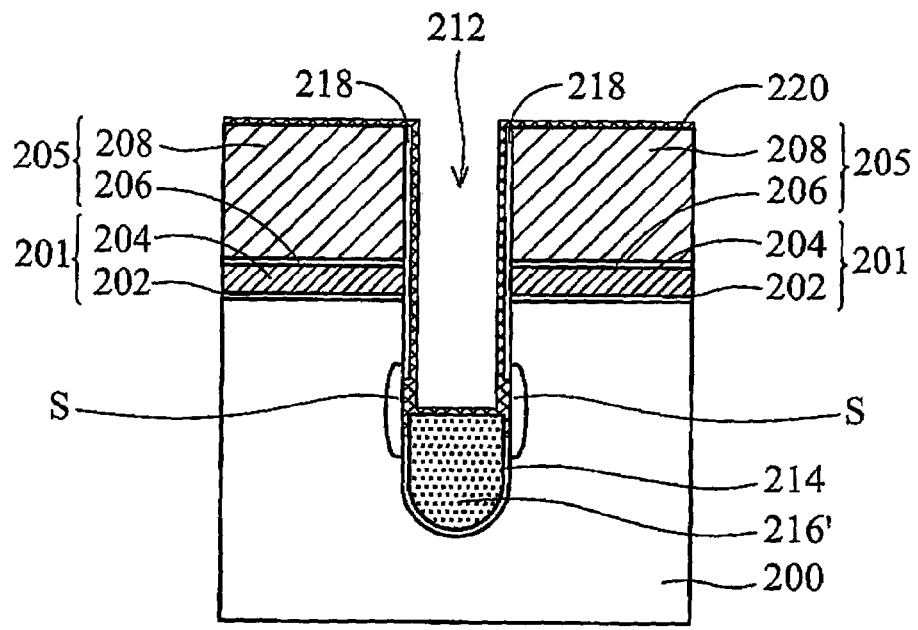

In FIG. 4, the conductive layer 216 in the trench 212 is etched back again to lower the conductive layer 216 below the insulating spacer 218. Subsequently, the liner oxide 214 between the insulating spacer 218 and the conductive layer 216 is removed by isotropic etching, such as wet etching, to expose a part of the substrate 200. The remaining conductive layer 216 in a lower portion of the trench 212 forms a conductive line 216' serving as a source line insulated from the substrate 200 by the remaining liner oxide 214. Next, a conformable conductive layer 220, such as a doped polysilicon layer, is formed on the second mask layer 205 and the surface of the trench 212 by conventional deposition, such as CVD. Next, a doping region S is formed in the exposed substrate 200 of the trench 212 adjacent to an upper portion of the conductive line (source line) 216' by performing a high temperature drive-in process on the conductive layer 220, serving as a source region.

Figure 5:
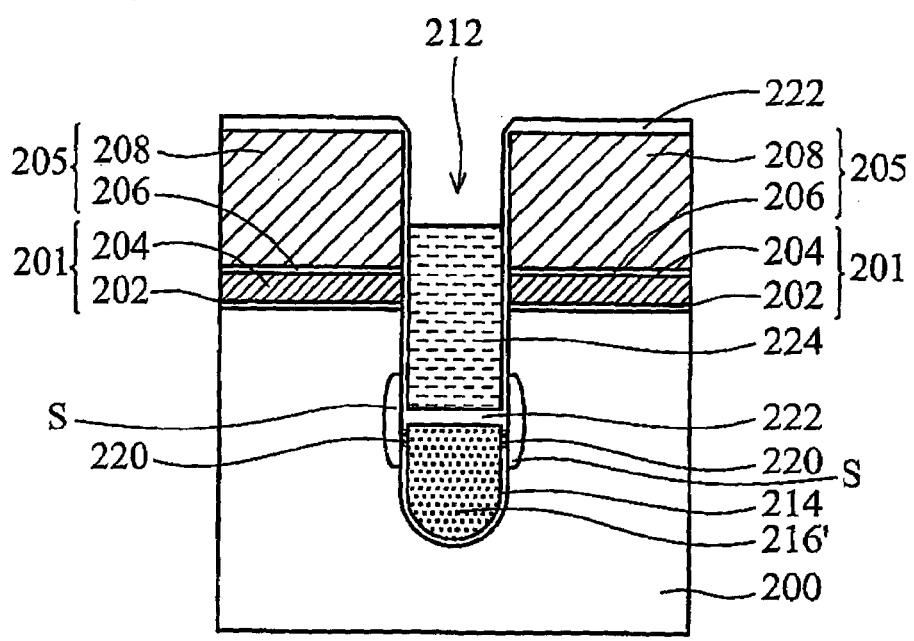

In FIG. 5, the conductive layer 220 over the conductive line 216' is etched back to leave a part of conductive layer 220 on the liner oxide 214 to make connection between the conductive line 216' and the doping region S. Thereafter, the insulating spacer 218 is removed, and a conformable insulating layer 222, such as high density plasma oxide (HDP oxide), is formed on the second mask layer 205 and the surface of the trench 212 by CVD. Here, the top and bottom of the insulating layer 222 are thicker than the sidewall of the insulating layer 222. Next, the trench 212 is filled with a photoresist layer 224 which is etched back to below the top of the trench 212.

Figure 6:
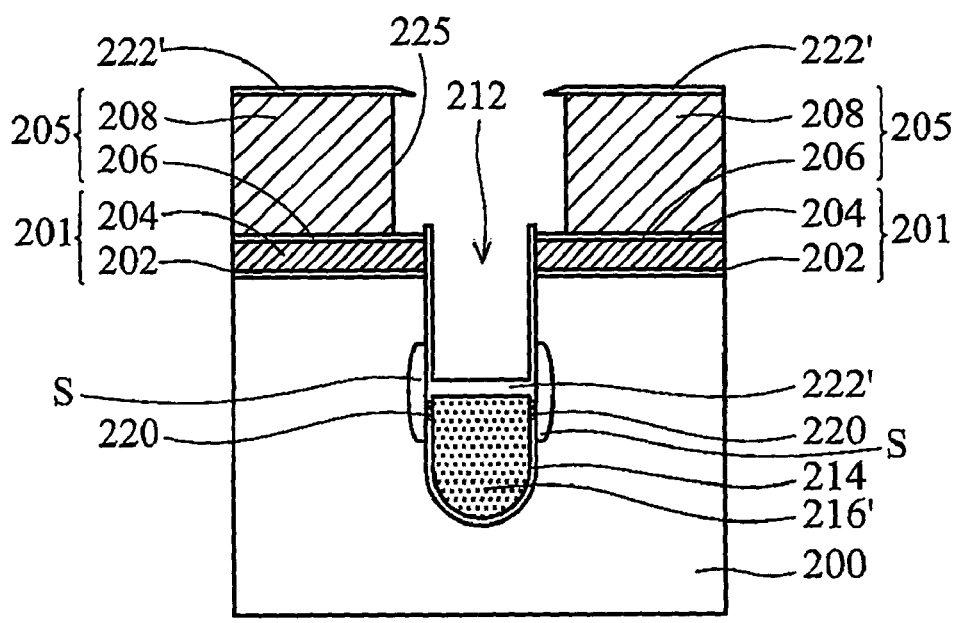

In FIG. 6, the insulating layer 222 on the sidewall of the trench 212 uncovered by the photoresist 224 is removed by isotropic etching, such as wet etching, using the photoresist layer 224 as a mask to expose the sidewall of the silicon nitride layer 208. Next, after the photoresist layer 224 is removed, the sidewall of the silicon nitride layer 208 is etched by isotropic etching, such as wet etching, using the remaining insulating layer 222' as a mask to expose the pad oxide 206 (etching stop layer) and form an opening 225 having a step profile.

Figure 7:
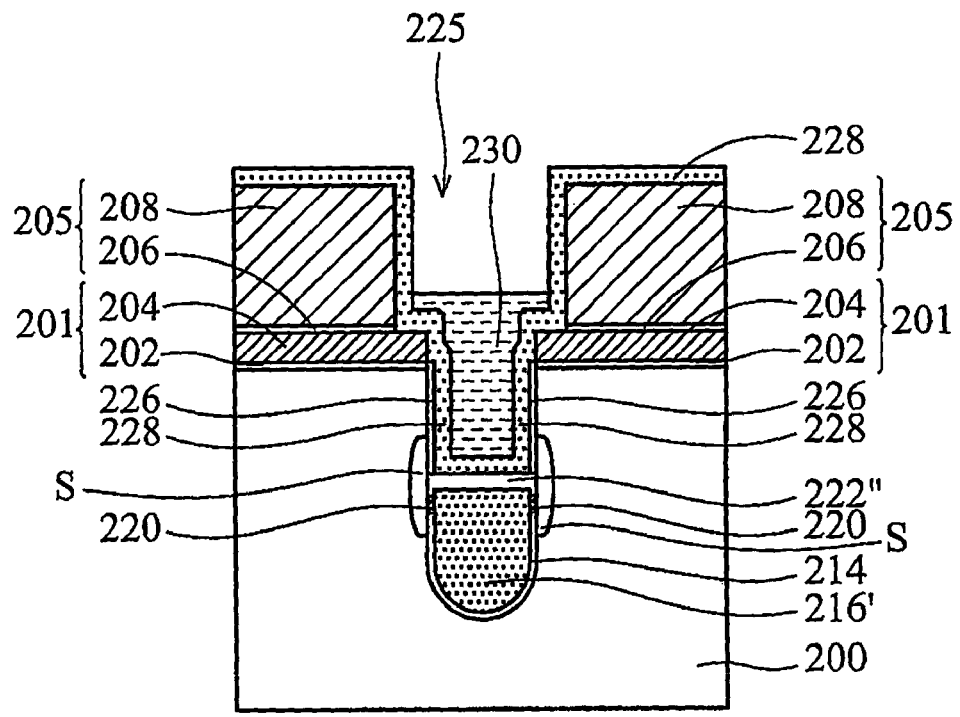
Figure 8:
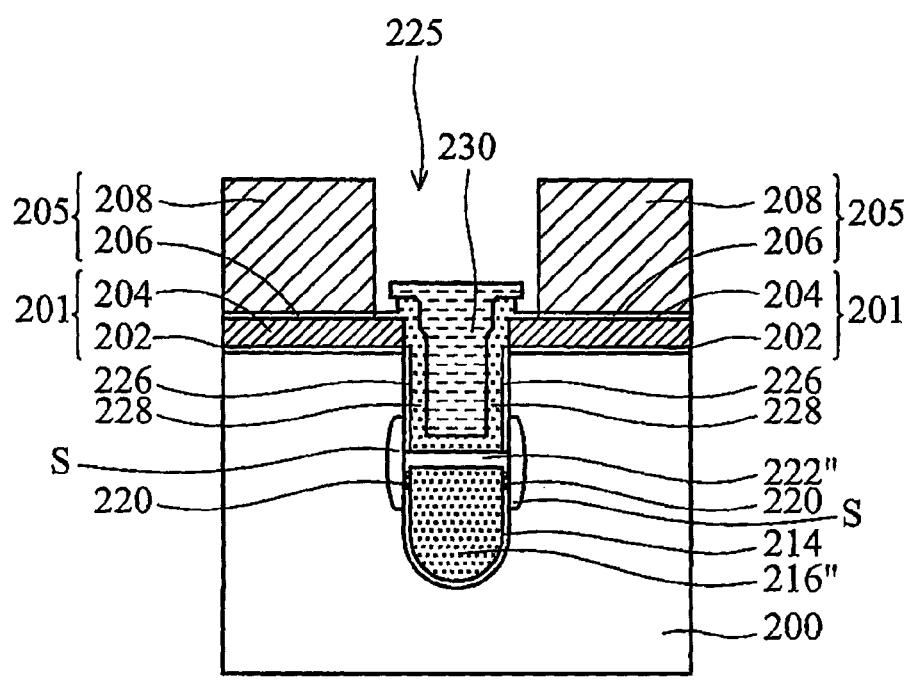
Figure 9:
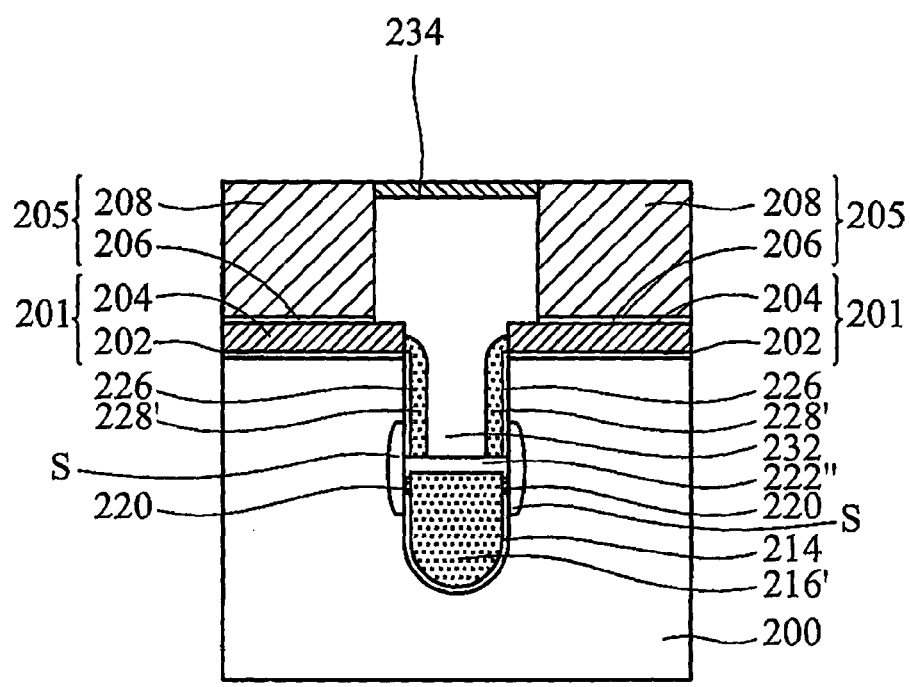

FIGS. 7–9 are cross-sections showing a method of forming a floating gate in the trench 212.

In FIG. 7, the insulating layer 222' on the silicon nitride layer 208 and the sidewall of the trench 212 and the pad oxide 206 in the opening 225 are removed by isotropic etching, such as wet etching, to leave the insulating layer 222" on the conductive line 216' and expose the first mask layer 201 in the opening 225 and the substrate 200 in the trench 212, respectively. Next, an oxide layer 226 is formed on the exposed substrate 200 in the trench 212 by thermal oxidation. Next, a conductive layer 228, such as doped polysilicon, having a thickness about 200~400 Å is formed on the second mask layer 205 and the surface of the opening 225. Thereafter, a sacrificial layer 230, such as photoresist, is formed on the second mask layer 205 and filled into the opening 225 and the trench 212. Next, a part of the sacrificial layer 230 is removed to lower it below the top of the opening 225. Here, the top of the remaining sacrificial layer 230 is higher than the conductive layer 228 formed on the bottom of the opening 225 in height.

In FIG. 8, the conductive layer 228 uncovered by the remaining sacrificial layer 230 is removed by isotropic etching, using the remaining sacrificial layer 230 as a mask.

In FIG. 9, after the remaining sacrificial layer 230 is removed, the conductive layer 228 is etched back by anisotropic etching, such as dry etching, to expose the insulating layer 222" and form a conductive spacer 228' on the sidewall of an upper portion of the trench 212 protruding the top of the substrate 200. Here, the conductive spacer 228' having a tip portion is used as a floating gate, and the tip portion discharges during erasing. Moreover, the oxide layer 226 is used as a gate oxide. Next, an insulating layer 232, such as oxide, is filled into the opening 225 by conventional deposition, such as low-pressure CVD (LPCVD). Subsequently, the insulating layer 232 is lowered below the top of the second mask layer 205. Next, a cap layer 234, such as silicon oxynitride or polysilicon, is deposited on the second mask layer 205 and the insulating layer 232. Thereafter, the excess cap layer 232 on the second mask layer 205 is removed by CMP.

Figure 10:
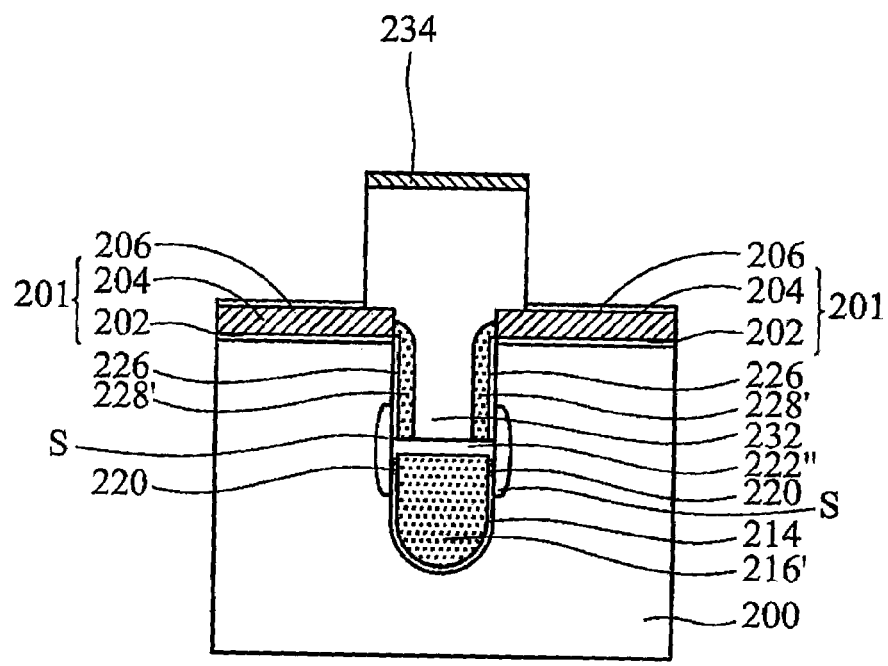
Figure 11:
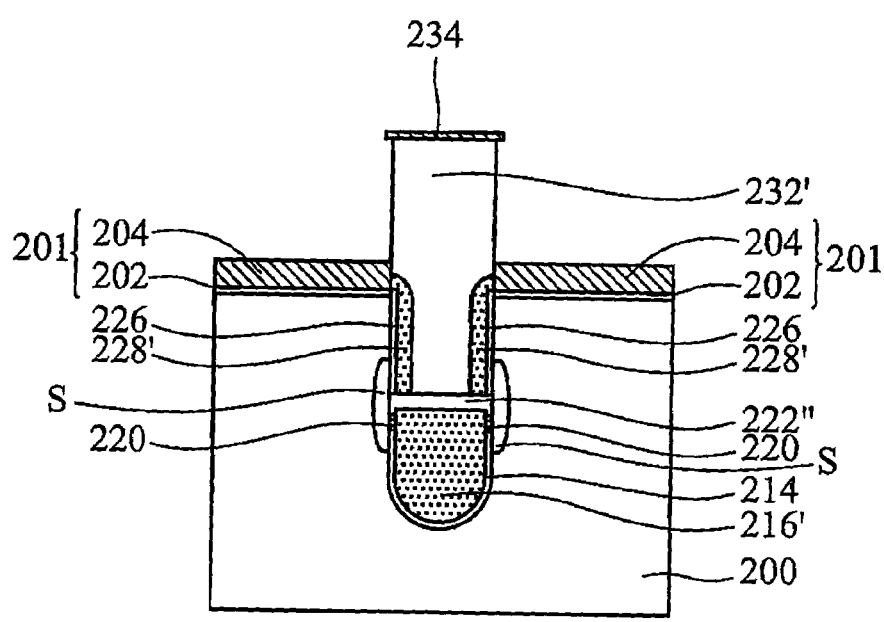

FIGS. 10 and 11 are cross-sections showing a method of forming an insulating stud on the insulating layer 222".

In FIG. 10, the silicon nitride layer 208 is etched using the cap layer 234 as a mask and the pad oxide 206 as an etching stop layer to expose a part of the insulating layer 232.

In FIG. 11, the exposed sidewall of the insulating layer 232 and the pad oxide 206 are etched by isotropic etching, such as wet etching, to expose the silicon nitride layer 204 and form an insulating stud 232' over the insulating layer 222" protruding the conductive spacer 228'.

FIGS. 12–15 are cross-sections showing a method of forming a control gate on the substrate 200 adjacent to the floating gate 228'.

Figure 12:
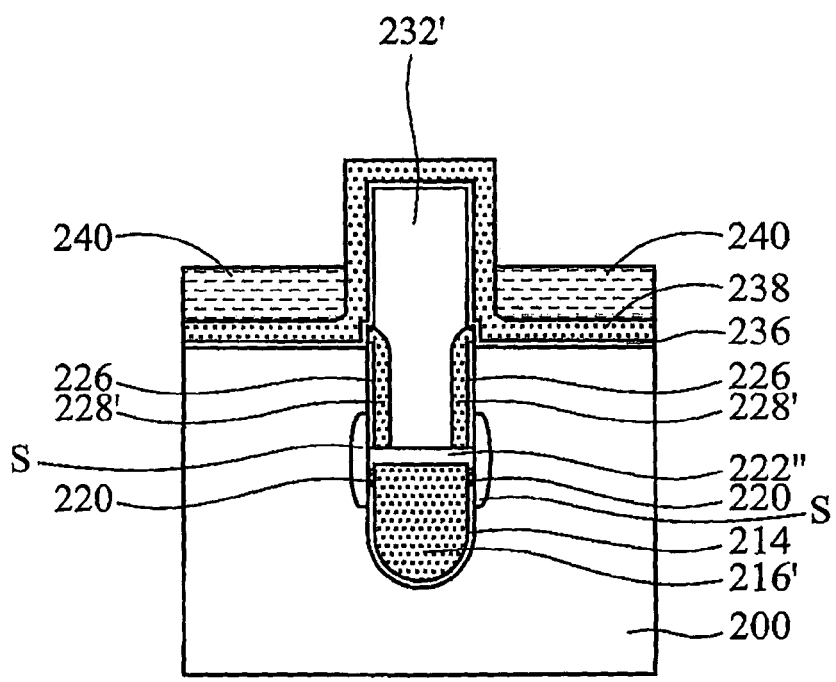

In FIG. 12, the cap layer 224 and the first mask layer 201 are sequentially removed to expose the substrate 200. Next, conformable oxide layer 236 having a thickness of about 100~500 Å and conductive layer 238, such as doped polysilicon, are sequentially formed on the surface of the substrate 200, the protruding floating gate 228', and the insulating stud 232'. Thereafter, a photoresist layer 240 is coated on the conductive layer 238. Next, the photoresist layer 240 is lowered below the top of the insulating stud 232' to expose a part of conductive is layer 238 over the sidewall and top of the insulating stud 232'.

Figure 13:
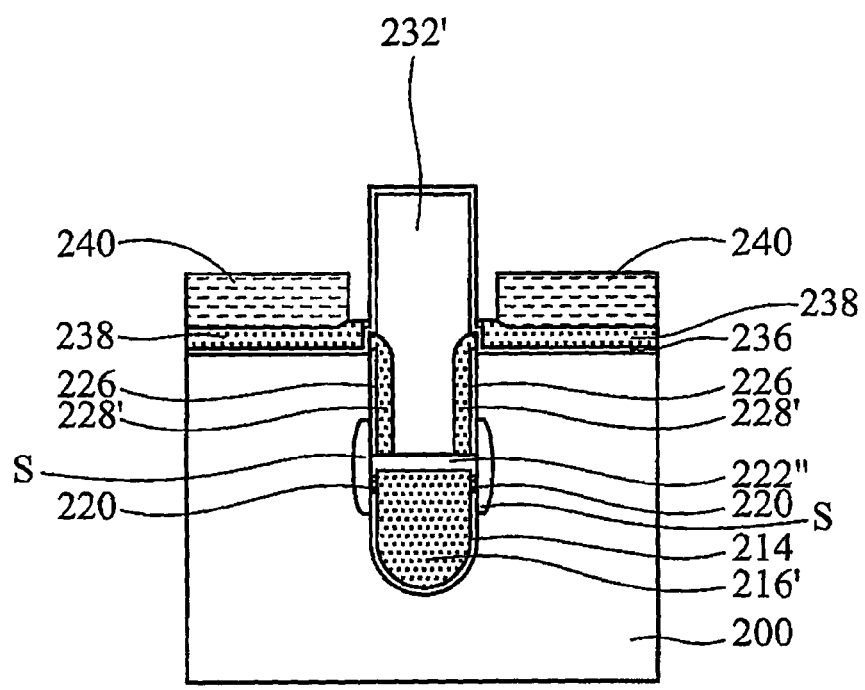

In FIG. 13, the exposed conductive layer 238 is etched using the photoresist layer 240 as a mask to leave the conductive layer 238 over the substrate 200 adjacent to the floating gate 228'. The conductive layer 238 is insulated from the floating gate 228' and the substrate 200 by the oxide layer 236.

Figure 14:
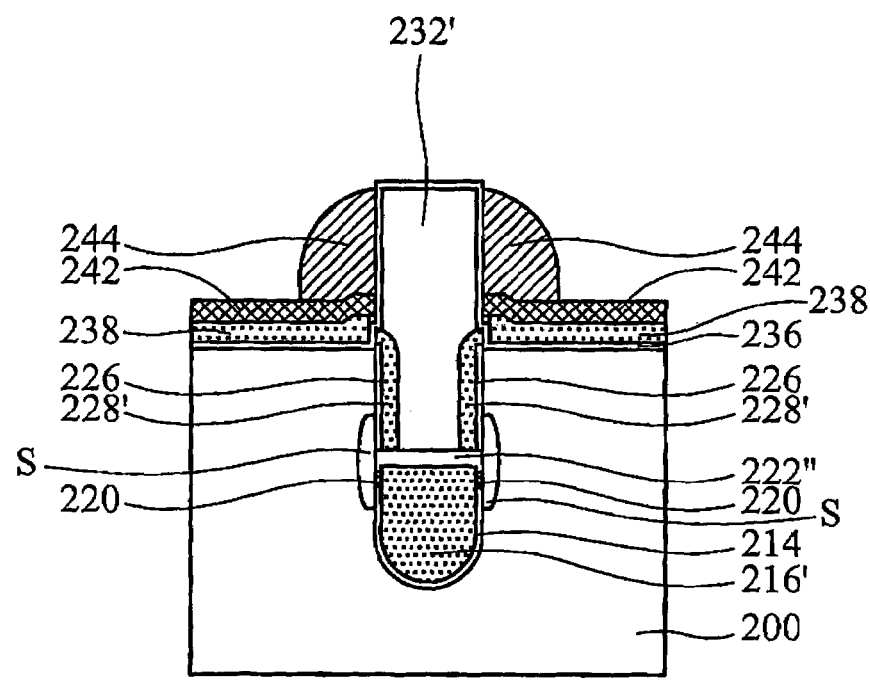

In FIG. 14, an optional conductive layer 242, such as tungsten silicide, having a thickness of about 500 Å is formed on the conductive layer 238 by the same approach of patterning the conductive layer 238 to reduce the resistance of the conductive layer 238. Thereafter, an insulating spacer 244, such as silicon nitride, having a thickness of about 1300 Å is formed on the sidewall of the insulating stud 232' to cover a part of the conductive layer 242.

Figure 15:
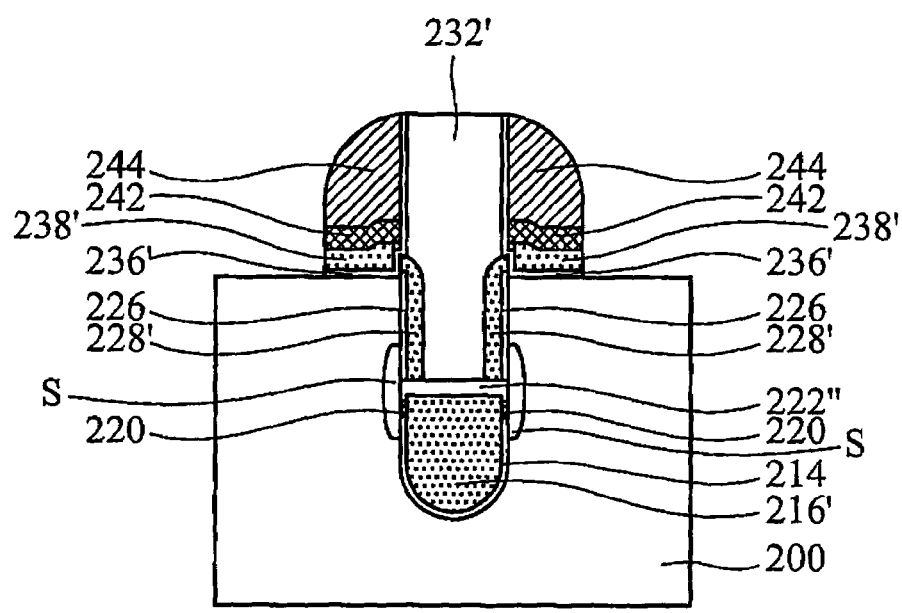

In FIG. 15, the conductive layer 242 and the underlying conductive layer 238 and oxide layer 236 are etched using the insulating spacer 244 as a mask to expose the substrate 200. The remaining conductive layer 238' is used as a control gate, and the remaining oxide layer 236' is used as a gate oxide.

Figure 16:
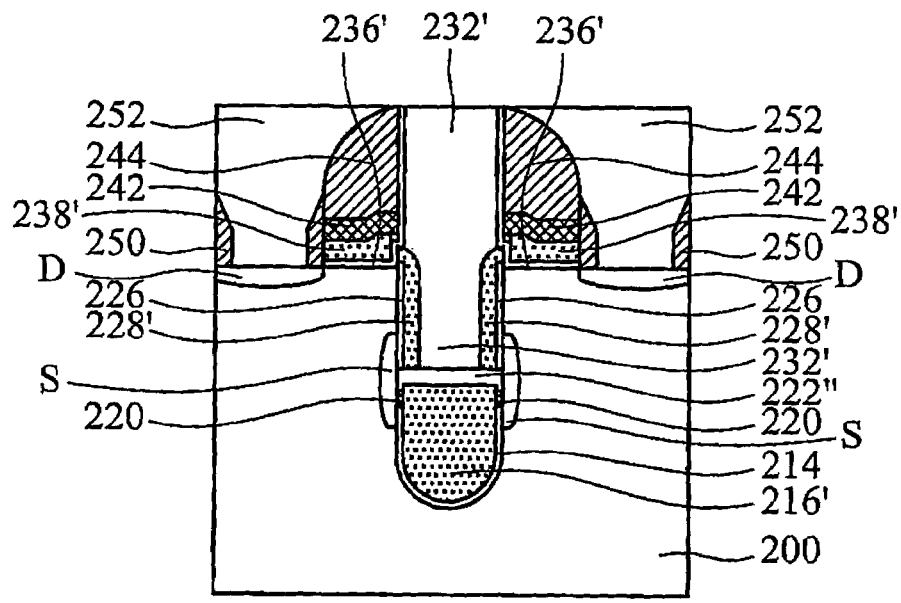

In FIG. 16, a conformable insulating layer (not shown), such as silicon nitride, is formed on the substrate according to the FIG. 15 by conventional deposition, such as CVD. Subsequently, the insulating layer is etched by anisotropic etching, such as dry etching, to form an insulating spacer 250 on the sidewall of the control gate 238'. Thereafter, a doping region D is formed in the exposed substrate 200 by ion implantation. Next, annealing is performed. Here, the doping region D is used as a drain region. Next, an insulating layer 252, such as silicon oxide or borophosphosilicate glass (BPSG), is formed on the drain region D. Subsequently, the insulating layer 252 is polished by CMP using the insulating spacer 244 as a stop layer.

Figure 17:
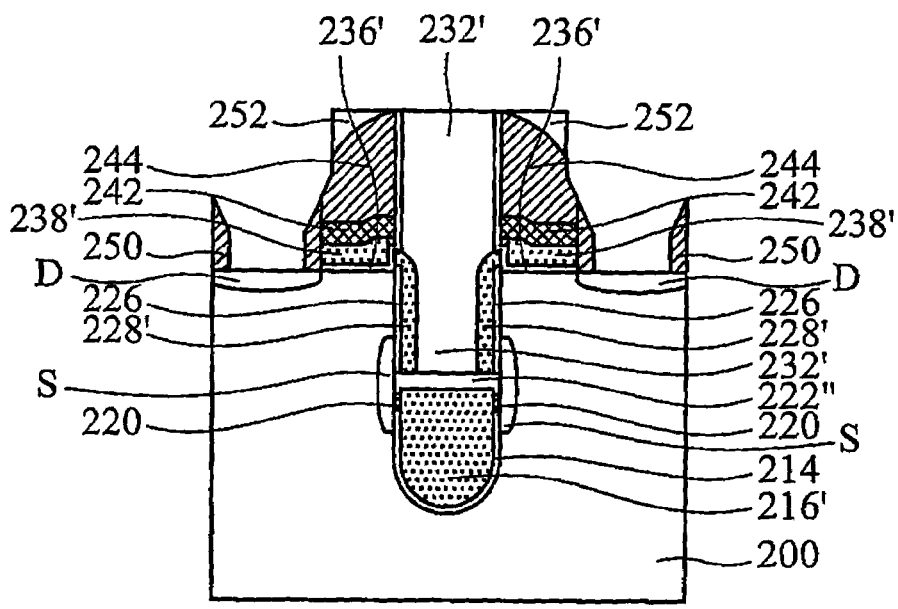

In FIG. 17, lithography and etching are performed on the insulating layer 252 to expose the drain region D.

Figure 18:
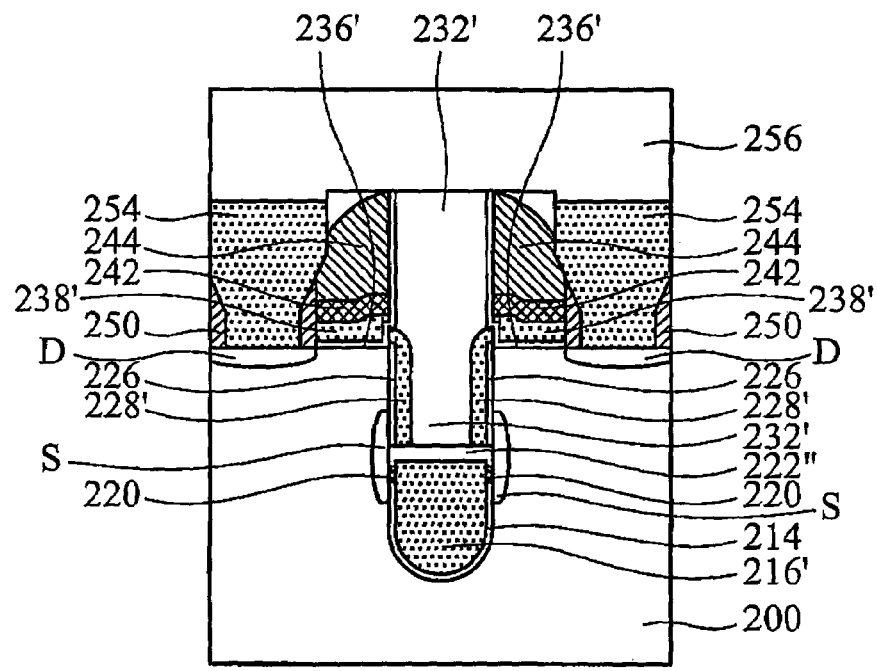

In FIG. 18, a conductive plug 254, such as doped polysilicon, is formed on the drain region D serving as a bit line contact. Thereafter, a cap layer 256, such as tetraethyl orthosilicate (TEOS) oxide, is formed on the conductive plug 254, insulating spacer 244, and the insulating stud 232'.

Figure 19:
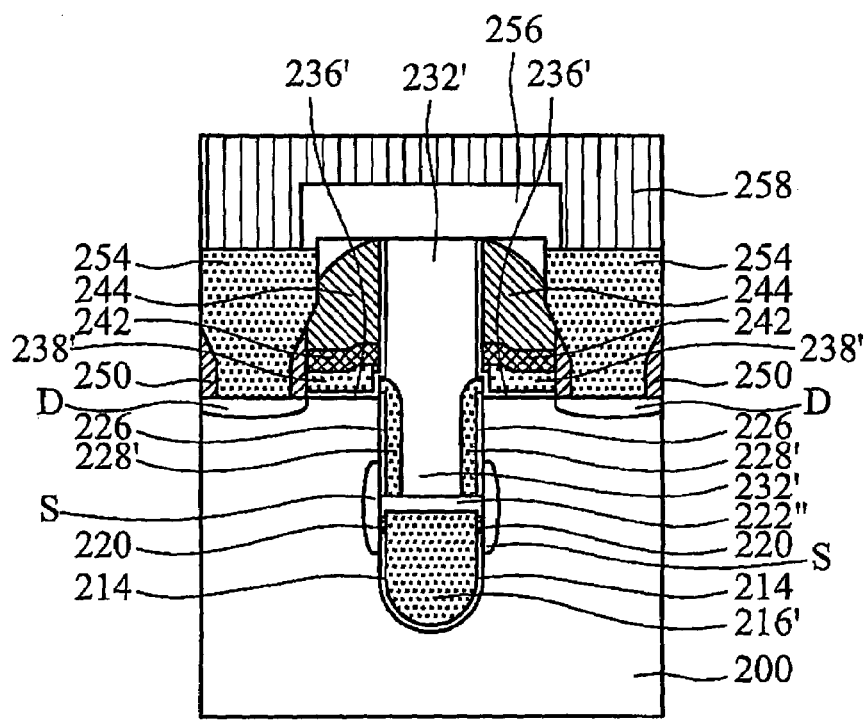

In FIG. 19, dual damascene process is used to form a bit line as follow. Lithography and etching are performed on the cap layer 256 to remove the portion of the cap layer 256 on the conductive plug 254. Next, a conductive layer 258, such as tungsten, is formed on the conductive plug 254 and the remaining cap layer 256. Finally, the conductive layer 258 is polished by CMP to form a bit line 258 and finish the split gate flash memory cell fabrication of the present invention.

Also. FIG. 19 is a cross-section showing the structure of the split gate flash memory cell according to the present invention. The memory cell includes a substrate 200, such as a silicon wafer, having a trench. A conductive line 216', such as polysilicon, is disposed in a lower portion of the trench serving as a source line. The source line 216' is insulated from the substrate 200 by an oxide layer 226.

A source region S is formed in substrate 200 adjacent to an upper portion of the source line 216'. A conductive spacer 228' is disposed on the sidewall of an upper portion of the trench and protrudes from the top of the substrate 200 serving as a floating gate. The floating gate 228' is insulated from the substrate 200 by the gate oxide 226.

The floating gate 228' is insulated from the source line 216' by an insulating layer 222'', such as HDP oxide. An insulating stud 232' is disposed on the insulating layer 222''.

A conductive layer 238', such as doped polysilicon, is disposed on the substrate 200 adjacent to the floating gate 228' serving as a control gate. The control gate 238' is insulated from the floating gate 228' and the substrate 200 by gate oxide 236'.

An insulating spacer 244 is disposed on the sidewall of the insulating stud 232' and an insulating spacer 250 is disposed on the sidewall of the control gate 238'. These insulating spacers 244, 250 can be silicon nitride. A conductive layer 242, such as tungsten silicide, is disposed between the insulating spacer 244 and the control gate 238'. A drain region D is formed in the substrate 200 adjacent to the control gate 238'.

A conductive plug 254, such as doped polysilicon, is disposed on the drain region D serving as a bit line contact. A cap layer 256, such as TEOS oxide, is disposed on the insulating stud 232' and the insulating spacer 244. A conductive layer 258, such as tungsten, is disposed on the conductive plug 254 and the cap layer 256 serving as a bit line.

Compared to the prior art, in the split gate flash memory cell of the invention, the floating gate and source line are disposed in the trench to effectively increase the integration of ICs by reducing the size of the memory cell. Moreover, no alignment issues occur during control gate fabrication, and the critical dimension (CD) can be controlled by adjusting the thickness of the insulating spacer over the control gate. In addition, the conductive plug is formed by self-alignment to simplify the process of fabricating the split gate flash memory.

The foregoing description has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A split gate flash memory cell, comprising:
   a substrate having a trench;
   a conductive line disposed in a lower portion of the trench and insulated from the substrate serving as a source line;
   a source region formed in the substrate adjacent to an upper portion of the conductive line;
   an insulating layer disposed on the conductive line;
   a conductive spacer disposed on an upper sidewall portion of the trench serving as a floating gate, protruding and insulated from the substrate;
   a first insulating stud disposed on the insulating layer, with the top thereof higher than that of the conductive spacer;
   a first conductive layer disposed over the substrate adjacent to the conductive spacer, serving as a control gate, the first conductive layer insulated from the conductive spacer and the substrate, respectively;
   a first insulating spacer disposed on the sidewall of the insulating stud to cover the first conductive layer; and
   a drain region formed in the substrate adjacent to the first conductive layer.

2. The memory cell as claimed in claim 1, further comprising a second conductive layer disposed between the first conductive layer and the first insulating spacer.

3. The memory cell as claimed in claim 2, wherein the second conductive layer is tungsten silicide.

4. The memory cell as claimed in claim 1, further comprising a second insulating spacer disposed on the sidewall of the first conductive layer.

5. The memory cell as claimed in claim 4, wherein the first and second insulating spacers are silicon nitride.

6. The memory cell as claimed in claim 1, further comprising:
   a conductive plug disposed on the drain region serving as a bit line contact;
   a cap layer disposed over the insulating stud and the first insulating spacer; and
   a third conductive layer serving as a bit line disposed on the conductive plug and the cap layer.

7. The memory cell as claimed in claim 6, wherein the conductive plug is doped polysilicon.

8. The memory cell as claimed in claim 6, wherein the cap layer is silicon oxide.

9. The memory cell as claimed in claim 6, wherein the third conductive layer is tungsten.

10. The memory cell as claimed in claim 1, wherein the conductive line is polysilicon.

11. The memory cell as claimed in claim 1, wherein the insulating layer is high density plasma oxide.

12. The memory cell as claimed in claim 1, wherein the conductive spacer is doped polysilicon.

13. The memory cell as claimed in claim 1, wherein the insulating stud is silicon oxide or boron silicate glass.

14. The memory cell as claimed in claim 1, wherein the first conductive layer is polysilicon.

15. A split gate flash memory cell, comprising:
   a substrate having a trench;
   a polysilicon line disposed in a lower portion of the trench and insulated from the substrate serving as a source line;
   a source region formed in the substrate adjacent to an upper portion of the polysilicon line;
   an insulating layer disposed on the polysilicon line;
   a polysilicon spacer disposed on an upper sidewall portion of the trench serving as a floating gate, protruding and insulated from the substrate;
   an insulating disposed on the insulating layer, with the top thereof higher than that of the polysilicon spacer;
   a polysilicon layer disposed over the substrate adjacent to the polysilicon spacer, serving as a control gate, with the polysilicon layer insulated from the polysilicon spacer and the substrate, respectively;
   a first insulating spacer disposed on the sidewall of the first insulating stud to cover the polysilicon layer;
   a second insulating spacer disposed on the sidewall of the polysilicon layer; and
   a drain region formed in the substrate adjacent to the polysilicon layer.

16. The memory cell as claimed in claim 15, further comprising a tungsten silicide layer disposed between the polysilicon layer and the first insulating spacer.

17. The memory cell as claimed in claim 15, wherein the first, second, and third insulating spacers are silicon nitride.

18. The memory cell as claimed in claim 15, further comprising:
   a polysilicon plug disposed on the drain region serving as a bit line contact;
   a cap layer disposed over the insulating and the first insulating stud spacer; and
   a tungsten layer serving as a bit line disposed on the polysilicon plug and the cap layer.

19. The memory cell as claimed in claim 18, wherein the cap layer is silicon oxide.

20. The memory cell as claimed in claim 15, wherein the insulating layer is high density plasma oxide.

21. The memory cell as claimed in claim 15, wherein the first insulating is silicon oxide or boron silicate glass.

* * * * *